United States Patent
Anderl et al.

(12)

(10) Patent No.: US 10,557,734 B2
(45) Date of Patent: Feb. 11, 2020

(54) AIRFLOW SENSOR FOR A HEAT SINK

(71) Applicant: International Business Machines Corporation, Armonk, NY (US)

(72) Inventors: William J. Anderl, Rochester, MN (US); Bret P. Elison, Rochester, MN (US); Phillip V. Mann, Rochester, MN (US); Chelsie M. Peterson, Dexter, MN (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 15/979,453

(22) Filed: May 14, 2018

(65) Prior Publication Data

US 2018/0259381 A1    Sep. 13, 2018

Related U.S. Application Data

(62) Division of application No. 14/958,405, filed on Dec. 3, 2015, now Pat. No. 10,054,473.

(51) Int. Cl.
*G05D 15/00* (2006.01)
*G01F 1/688* (2006.01)
*H01L 23/34* (2006.01)
*H01L 23/467* (2006.01)

(52) U.S. Cl.
CPC ............ *G01F 1/6888* (2013.01); *H01L 23/34* (2013.01); *H01L 23/467* (2013.01)

(58) Field of Classification Search
CPC .......... G01F 1/6888; G01F 1/69; G01F 1/692; G01F 1/64; G01F 3/226; G01F 3/227; H04L 23/34; H04L 23/467; F24F 2110/32; F24F 3/02
See application file for complete search history.

(56) References Cited

U.S. PATENT DOCUMENTS

| | | | |
|---|---|---|---|
| 3,691,833 A | 9/1972 | Fujikake et al. | |
| 5,612,677 A | 5/1997 | Baudry | |
| 6,443,003 B1 | 9/2002 | Bailis | |
| 6,496,118 B1 | 12/2002 | Smith | |

(Continued)

OTHER PUBLICATIONS

Anderl et al., "Airflow Sensor for a Heat Sink" U.S. Appl. No. 14/958,405, filed Dec. 3, 2015.

(Continued)

*Primary Examiner* — Travis C Ruby
(74) *Attorney, Agent, or Firm* — Martin & Associates, LLC; Derek P. Martin

(57) ABSTRACT

An airflow sensor for a heat sink has a substantially flat base portion and a deformable upper portion electrically coupled to the base portion that contacts a conductive strip. As airflow increases, the deformable upper portion deforms and moves away from the source of airflow, which moves the point of contact between the deformable upper portion and the conductive strip farther away from the source of the airflow. The difference in the point of contact is measured, and is used to characterize the airflow sensor for different airflows. Data from the airflow sensor can then be logged during system operation. When needed, the data from the airflow sensor can be read from the log and converted to airflow using the airflow sensor characterization data. In this manner the airflow through a heat sink may be dynamically measured, allowing analysis and correlation between system events and airflow through the heat sink.

4 Claims, 4 Drawing Sheets

(56) References Cited

U.S. PATENT DOCUMENTS

| | | |
|---|---|---|
| 6,516,785 B1 | 2/2003 | Nakada et al. |
| 2003/0090883 A1 | 5/2003 | Asahi et al. |
| 2008/0040067 A1 | 2/2008 | Bashor et al. |
| 2009/0210190 A1 | 8/2009 | Carlson et al. |
| 2010/0123240 A1 | 5/2010 | Sato et al. |
| 2011/0272768 A1 | 11/2011 | Nakamura et al. |
| 2012/0199310 A1 | 8/2012 | Koenig et al. |
| 2015/0000395 A1 | 1/2015 | Tashiro et al. |

OTHER PUBLICATIONS

Anderl et al., "Airflow Sensor for a Heat Sink" U.S. Appl. No. 15/044,063, filed Feb. 15, 2016.
Anderl et al., "Airflow Sensor for a Heat Sink" U.S. Appl. No. 15/813,435, filed Nov. 15, 2017.
Appendix P—List of IBM Patents or Patent Applications Treated As Related, dated Jun. 14, 2018.
Azar, Kaveh, "ATS White Paper—Air Flow Measurement in Electronic Systems", May 13, 2015.
Swapnali et al., "Experimental Analysis of Heat Transfer Enhancement Using Fins", International Journal for Technological Research in Engineering, vol. 1, Issue 11, Jul. 2014.

AIRFLOW SENSOR FOR A HEAT SINK

BACKGROUND

1. Technical Field

This disclosure generally relates to airflow sensors, and more specifically relates to an airflow sensor for a heat sink.

2. Background Art

Heat sinks are commonly used in modern electronic systems to dissipate heat generated by electronic components, such as processors. A source of air such as a fan is typically placed in proximity to a heat sink to produce airflow over the heat sink, which enhances the ability of the heat sink to dissipate heat.

Modern heat sinks are typically modeled using thermal simulation. Prototypes are then built, which are qualified with thermal test vehicles and flow benches. However, even with thermal simulation and flow bench qualification, a heat sink may behave differently in a system than modeled. Oftentimes the internal environment is difficult to predict and model.

SUMMARY

An airflow sensor for a heat sink has a substantially flat base portion and a deformable upper portion electrically coupled to the base portion that contacts a conductive strip. As airflow increases, the deformable upper portion deforms and moves away from the source of airflow, which moves the point of contact between the deformable upper portion and the conductive strip farther away from the source of the airflow. The difference in the point of contact is measured, and is used to characterize the airflow sensor for different airflows. Data from the airflow sensor can then be logged during system operation. When needed, the data from the airflow sensor can be read from the log and converted to airflow using the airflow sensor characterization data. In this manner the airflow through a heat sink may be dynamically measured, allowing analysis and correlation between system events and airflow through the heat sink.

The foregoing and other features and advantages will be apparent from the following more particular description, as illustrated in the accompanying drawings.

BRIEF DESCRIPTION OF THE DRAWING(S)

The disclosure will be described in conjunction with the appended drawings, where like designations denote like elements, and:

DETAILED DESCRIPTION

The disclosure and claims herein relate to an airflow sensor for a heat sink that has a substantially flat base portion and a deformable upper portion electrically coupled to the base portion that contacts a conductive strip. As airflow increases, the deformable upper portion deforms and moves away from the source of airflow, which moves the point of contact between the deformable upper portion and the conductive strip farther away from the source of the airflow. The difference in the point of contact is measured, and is used to characterize the airflow sensor for different airflows. Data from the airflow sensor can then be logged during system operation. When needed, the data from the airflow sensor can be read from the log and converted to airflow using the airflow sensor characterization data. In this manner the airflow through a heat sink may be dynamically measured, allowing analysis and correlation between system events and airflow through the heat sink.

Figure 1:
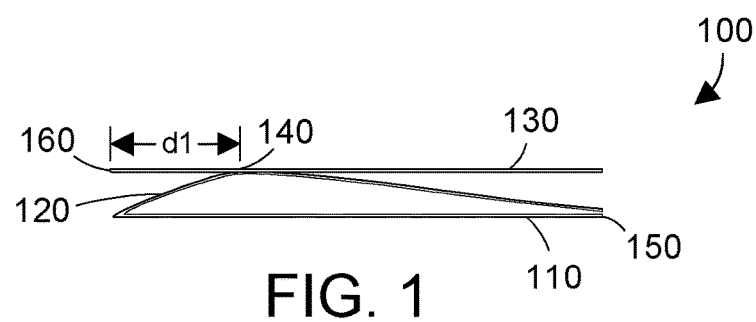
FIG. 1 is a side view of an airflow sensor for a heat sink.

Referring to FIG. 1, an airflow sensor 100 comprises a base portion 110 electrically coupled to a deformable portion 120 that contacts an electrically conductive strip 130. In the most preferred implementation, the base portion 110 and the deformable portion 120 are made from a single piece of material, such as metal. The deformable portion 120 is designed so when there is no airflow present, the deformable portion 120 contacts the conductive strip 130 at a first point 140 shown in FIG. 1. The base portion 110 includes a first point of electrical contact 150 and the conductive strip 130 includes a second point of electrical contact 160. Measuring resistance between the first and second electrical points of contact 150 and 160 results in a first resistance reading. The contact point 140 for the deformable portion when there is no airflow present is shown at a distance d1 in FIG. 1 from the point of contact 160 on the conductive strip 130.

Figure 2:
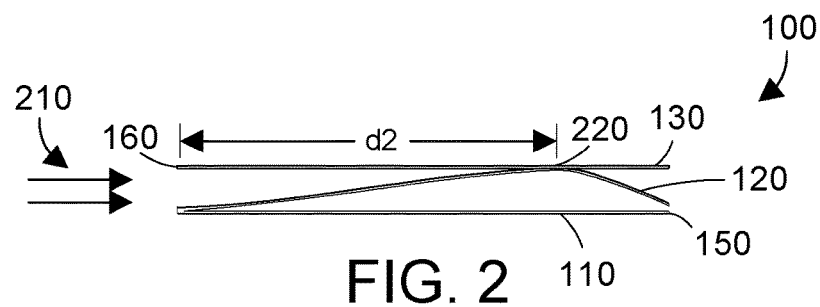
FIG. 2 is a side view of the airflow sensor of FIG. 1 showing how the contact point moves with airflow.

The deformable portion 120 is deformable under the force of airflow. Referring to FIG. 2, in the presence of airflow represented as 210 in FIG. 2, deformable portion 120 deforms into a shape that moves the point of contact between the deformable portion 120 and the conductive strip 130 to a point 220 that is farther away from the airflow than the point 140 in FIG. 1 when there is no airflow present. Point 220 in FIG. 2 is shown at a distance d2 from the point of contact 160 on the conductive strip 130, which is farther away from the airflow 210 than distance dl for contact point 140 shown in FIG. 1. The result of the deformable portion moving its contact point from 140 in FIGS. 1 to 220 in FIG. 2 due to the force of airflow 210 is a second resistance reading between the first and second electrical contact points 150 and 160 that is greater than the first resistance reading in FIG. 1. This difference in electrical resistance can be measured and used to determine airflow across the airflow sensor 100.

FIGS. 1 and 2 show side views of the airflow sensor 100, which does not indicate the width of the airflow sensor 100 that would be in contact with the airflow 210. At one extreme, the airflow sensor 100 could have a cross-section with respect to the airflow 210 that is very small, meaning the airflow sensor 100 could have a width of a human hair or less. At the other extreme, the airflow sensor 100 could have a cross-section with respect to the airflow 210 that is significant, meaning the airflow sensor 100 substantially disrupts the airflow 210. In the most preferred implementation, the airflow sensor 100 has a geometry resembling a flat ribbon that is preferably more than a millimeter and less than ten millimeters wide. This flat ribbon geometry allows sufficient surface area for the airflow 210 to deform the deformable portion 120 without significantly disrupting the airflow 210. In addition, thickness of the ribbon could be adjusted according to airflow ranges. Thus, a thicker ribbon could be used to provide a reasonable deformation across the range of airflow when the expected airflow is high. A thinner ribbon could be used when the expected airflow is low. Using an appropriate specific design of airflow sensor 100 allows measuring airflow without significantly disrupting the airflow.

The airflow sensor 100 could be made from any suitable material or combination of materials. In the most preferred implementation, the base portion 110, the deformable portion 120, and the conductive strip 130 are all made of the same material. In the most preferred implementation, the preferred material is metal, such as copper, nickel, indium or tin. Of course, alloys of different metals could also be used. In addition, non-metallic conductors or semiconductors could also be used. Furthermore, the base portion 110, deformable portion 120 and conductive strip 130 could be made of different materials. Any suitable materials for the airflow sensor 100 could be used as long as the deformable portion 120 deforms under the force of airflow and a difference in resistance is generated due to differences in airflow.

Figure 3:
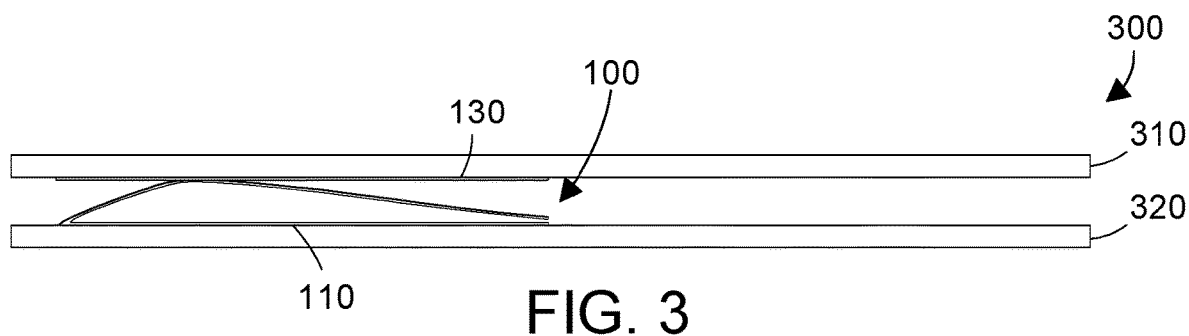
FIG. 3 is a side view of the airflow sensor of FIG. 1 mounted between two fins on a heat sink.

The airflow sensor 100 shown in FIGS. 1 and 2 can be used to measure airflow on a heat sink. Referring to FIG. 3, two fins 310 and 320 of a heatsink 300 are shown. Of course, the heat sink 300 could include other fins not shown in FIG. 3. The airflow sensor 100 is placed between fins 310 and 320 by bonding the conductive strip 130 to a lower surface of fin 310 and by bonding the base portion 110 to the upper surface of fin 320, as shown in FIG. 3. In one suitable implementation, either the base portion 110 could be electrically coupled to the fin 320 or the conductive strip 130 could be electrically coupled to the fin 310. In the most preferred implementation, both base portion 110 and conductive strip 130 are electrically insulated from the fins 310 and 320.

In the configuration shown in FIG. 3, the airflow sensor 100 will produce different values of electrical resistance with different amounts of airflow between the first fin 310 and second fin 320. Because the airflow sensor 100 minimally disrupts the airflow, the airflow sensor 100 provides crucial airflow information for a heat sink in an operating environment in a manner that does not significantly negatively impact the performance of the heat sink.

The placement of the airflow sensor 100 in FIG. 3 is shown on the left edge of the heatsink. Note, however, the airflow sensor 100 could be placed anywhere along the length of the heatsink 300 provided there is no obstruction to the airflow. Thus, airflow sensor 100 in FIG. 3 could be moved to the middle of heat sink 300 or to the right edge of heatsink 300. The disclosure and claims herein extend to any suitable location for the airflow sensor 100 on a heat sink 300.

Figure 4:
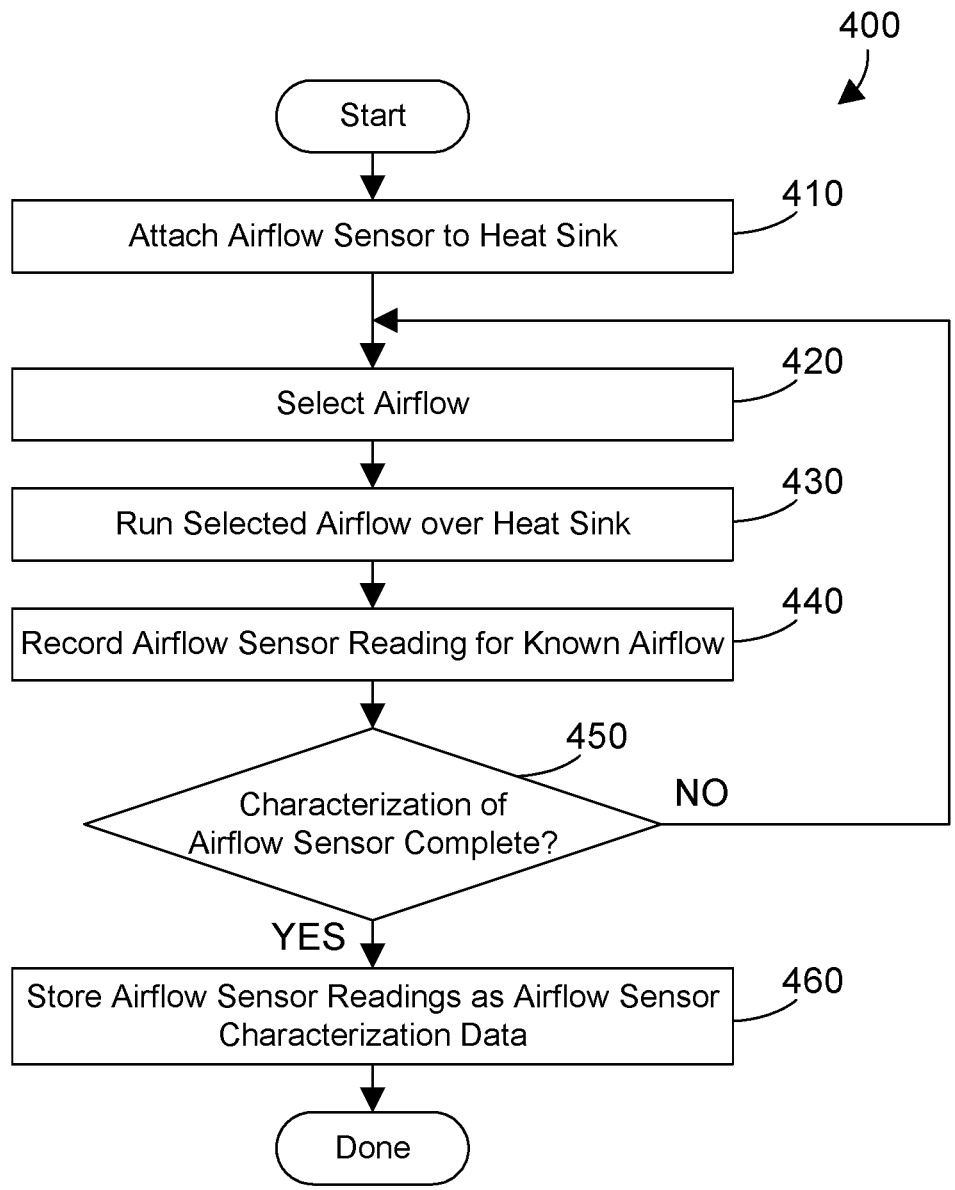
FIG. 4 is a flow diagram of a method for characterizing an airflow sensor.

While it is possible the airflow sensor 100 could be designed to provide resistance between the two electrical points 150 and 160 that is linearly proportional to airflow, other designs that do not provide such linear proportionality could also be used. In the most preferred implementation, the airflow sensor is tested and characterized so its performance is known, and future readings can be compared to the characterization data to determine airflow. Referring to FIG. 4, method 400 begins by attaching an airflow sensor to a heat sink (step 410), such as the configuration shown in FIG. 3. Next, the heat sink is placed on a flow bench, and a particular airflow is selected (step 420). The selected airflow is then run over the heat sink (step 430). The airflow sensor reading is recorded for the known airflow (step 440). We assume steps 420, 430 and 440 are repeated for several different airflows, so step 450=NO, and these steps are repeated with a different selected airflow. This characterization of airflow sensor readings to airflow continues until characterization of the airflow sensor is complete (step 450=YES), at which point the airflow sensor readings are stored as airflow sensor characterization data (step 460). The airflow sensor characterization data stored in step 460 can then be used to determine airflow over the airflow sensor at any given point in time based on the electrical resistance readings of the airflow sensor.

Figure 5:
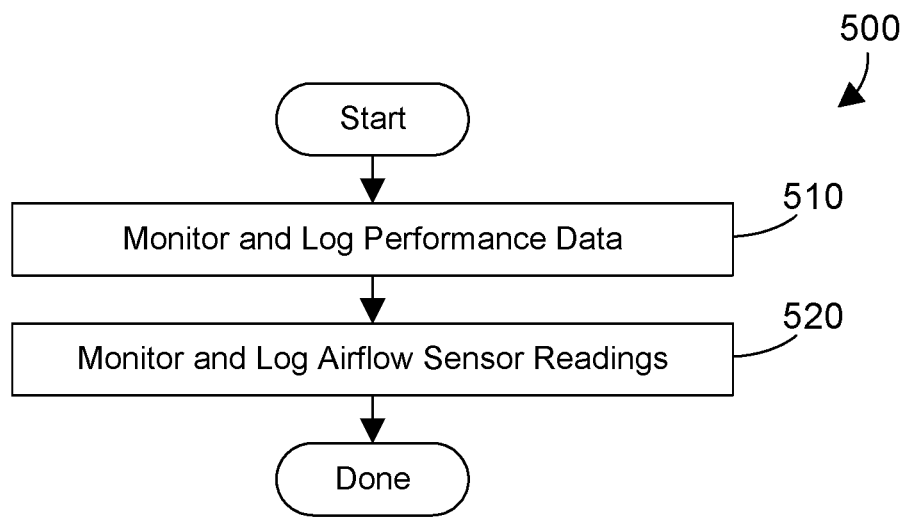
FIG. 5 is a flow diagram of a method for logging information as an electronic system runs.

Electronic systems often log performance data. Referring to FIG. 5, method 500 monitors and logs performance data for an electronic system (step 510), and additionally logs the airflow sensor readings (step 520). Logging airflow sensor readings at the same time other performance parameters are logged provides data from which airflow can be determined at particular points in time that correlate to the logged performance data.

Figure 6:
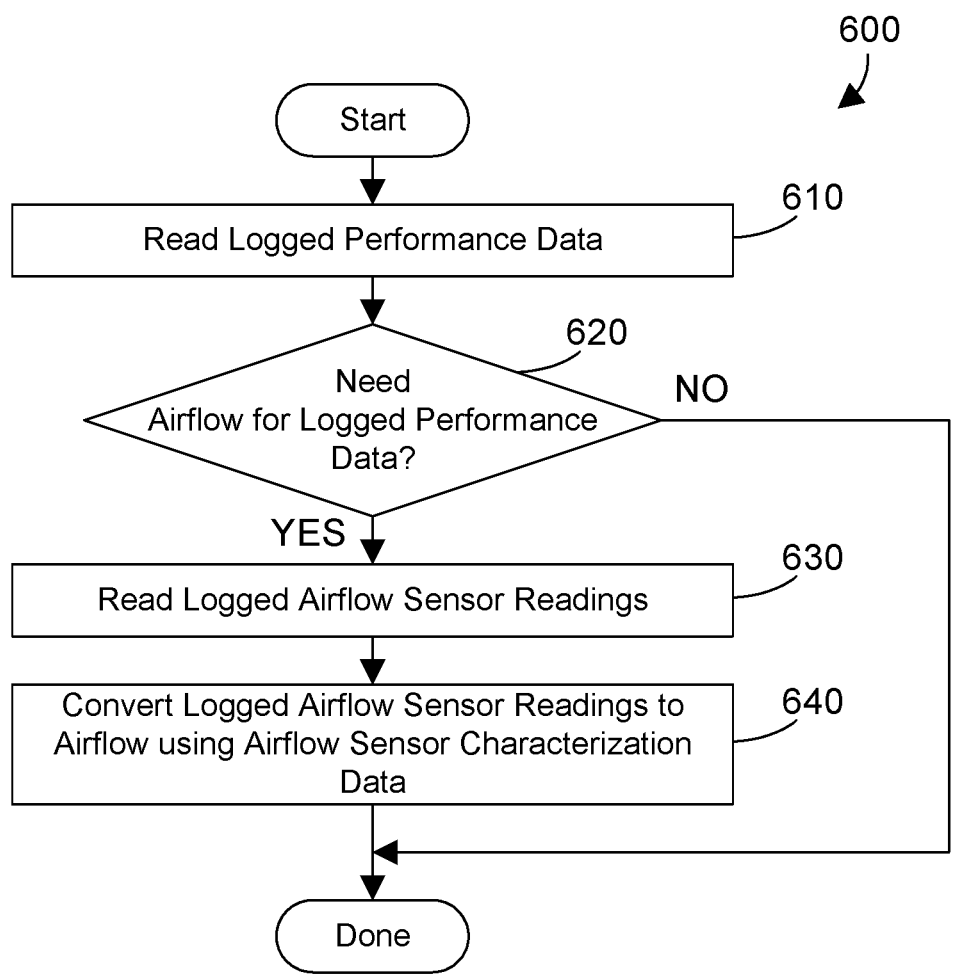
FIG. 6 is a flow diagram of a method for determining airflow in an electronic system using the airflow sensor.

Referring to FIG. 6, a method 600 begins by reading the logged performance data (step 610). When airflow for the logged performance data is not needed (step 620=NO), method 600 is done. For example, if the logged performance data is read in step 610 to determine memory utilization at a particular point in time, airflow will not affect memory utilization, so the airflow information is not needed. When airflow for the logged performance data is needed (step 620=YES), the logged airflow sensor readings are read (step 630), then converted to airflow using the airflow sensor characterization data (step 640). Method 600 thus provides logged performance data correlated with airflow, which allows determining whether airflow could have contributed to a logged event. For example, when a processor experiences a power throttling event, knowing the airflow at the time of the power throttle could provide an indication of whether proper airflow was being applied to the heat sink.

Figure 7:
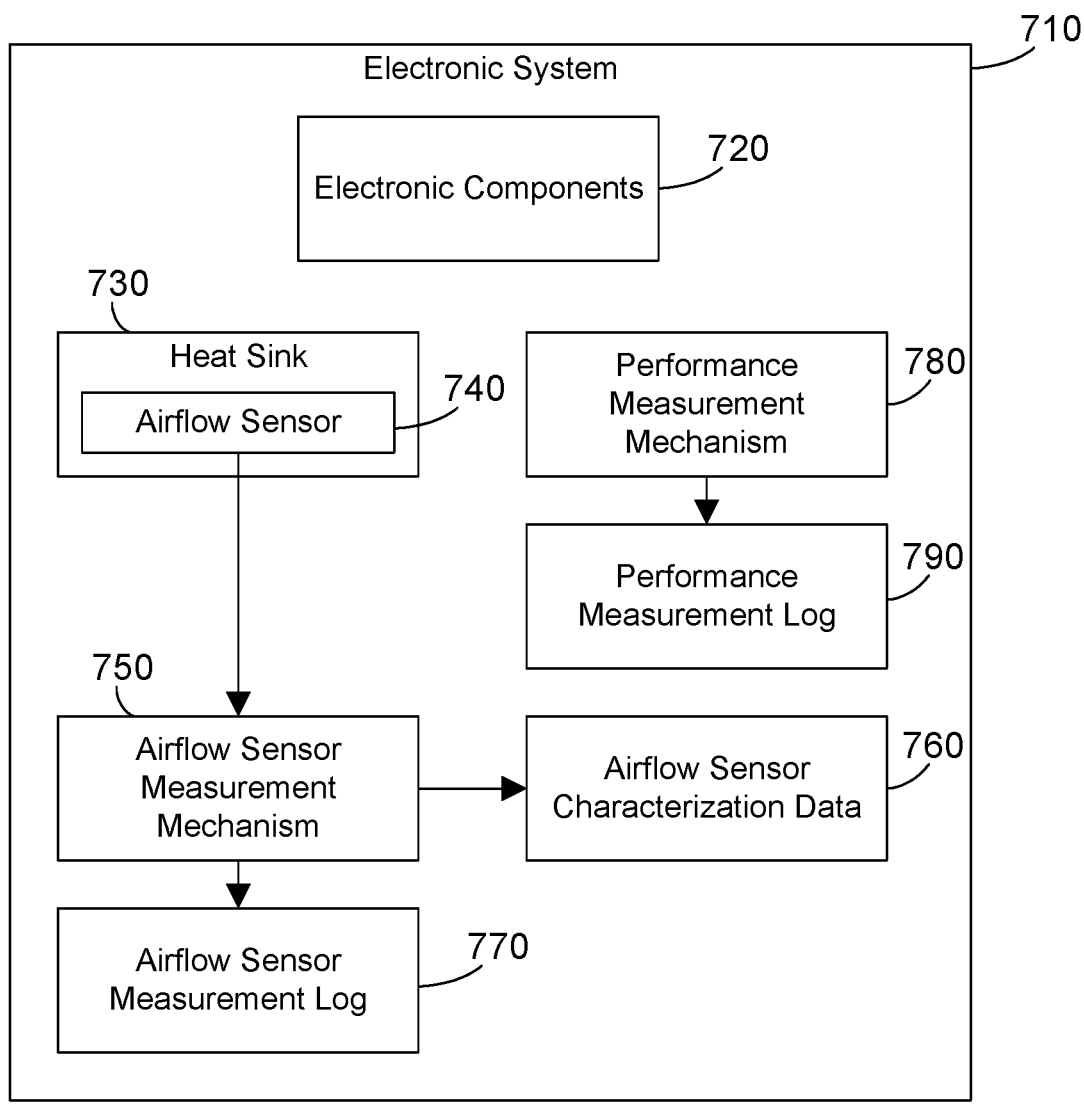
FIG. 7 is a block diagram of an electronic system that includes a heat sink with an airflow sensor as described and claimed herein.

Referring to FIG. 7, an electronic system 710 is shown, which includes electronic components 720. Electronic components 720 can include any type of electronic components, systems or subsystems, including without limitation processors, memory, integrated circuits, discrete logic, hard disk drives, I/O adapters, etc. A performance measurement mechanism 780 monitors and logs data in a performance measurement log 790. A heat sink 730 is provided for one or more of the electronic components 720 that includes an airflow sensor 740. Airflow sensor 100 shown in FIGS. 1-3 is one suitable implementation for airflow sensor 740 in FIG. 7. The airflow sensor 740 is connected to an airflow sensor measurement mechanism 750, which measures readings from the airflow sensor 740. In one suitable implementation, the readings could be electrical resistance. In another suitable implementation, the airflow sensor measurement mechanism 750 could measure a voltage across the airflow sensor 740. When steps are taken to characterize an airflow sensor as shown in method 400 in FIG. 4, the airflow sensor characterization data stored in step 460 is represented as 760 in FIG. 7. An airflow sensor measurement log 770 preferably includes airflow sensor measurements over time. In the most preferred implementation, both the performance measurement log 790 and airflow sensor measurement log 770 have timestamped entries that allow correlating the two. Thus, if the performance measurement mechanism 780 determines processor temperature rose at a given point in time, the airflow sensor measurement log 770 can be consulted to determine the airflow through the processor's heatsink at the same point in time. Correlating airflow to logged system events thus provides a way to determine whether airflow was a contributing factor in the logged system events.

Many variations are possible within the scope of the disclosure and claims herein. For example, while a single airflow sensor on a single heatsink is shown in FIG. 3, multiple airflow sensors could be used on a single heatsink, and a single airflow sensor could be used between two adjacent heatsinks. The use of multiple airflow sensors in different regions of a heatsink could be very helpful in testing and characterizing performance of a heat sink. In addition, multiple airflow sensors that have different properties could be used together. For example, three airflow sensors could be used on a heat sink, with a first airflow sensor that measures airflow up to a first threshold, a second airflow sensor that measures airflow from the first threshold to a second threshold, and the third airflow sensor that measure airflow from the second threshold to a third threshold. The disclosure and claims herein expressly extend to any suitable number of airflow sensors in any suitable configuration for measuring airflow on one or more heat sinks.

An airflow sensor for a heat sink has a substantially flat base portion and a deformable upper portion electrically coupled to the base portion that contacts a conductive strip. As airflow increases, the deformable upper portion deforms and moves away from the source of airflow, which moves the point of contact between the deformable upper portion and the conductive strip farther away from the source of the airflow. The difference in the point of contact is measured, and is used to characterize the airflow sensor for different airflows. Data from the airflow sensor can then be logged during system operation. When needed, the data from the airflow sensor can be read from the log and converted to airflow using the airflow sensor characterization data. In this manner the airflow through a heat sink may be dynamically measured, allowing analysis and correlation between system events and airflow through the heat sink.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. A method for determining airflow through a heat sink in an electronic system, the method comprising:
(A) providing a heat sink for an electronic component, the heat sink comprising:
a first thermally-conductive fin;
a second thermally-conductive fin substantially parallel to and underlying the first thermally-conductive fin and thermally coupled to the first thermally-conductive fin;
an airflow sensor comprising:
an electrically conductive strip coupled to a bottom surface of the first thermally-conductive fin, wherein the conductive strip comprises a first electrical point of contact;
a base portion coupled to a top surface of the second thermally-conductive fin, the base portion having a second electrical point of contact; and
a deformable upper portion electrically coupled to the base portion, wherein the deformable upper portion contacts the electrically conductive strip at a first contact point when there is no airflow, wherein airflow deforms the deformable upper portion so the deformable upper portion contacts the conductive strip at a second contact point farther away from a source of the airflow, and measurement is made between the first and second electrical points of contact to determine airflow through the airflow sensor;
(B) selecting an airflow;
(C) running the selected airflow over the heat sink;
(D) measuring electrical resistance between the first and second electrical points of contact;
(E) recording the measured electrical resistance as correlating to the selected airflow;
(F) repeating steps (B) through (E) for a plurality of airflows;
(G) storing the measured electrical resistance for the plurality of airflows as airflow sensor characterization data;
(H) monitoring and logging performance of the electronic system;
(I) monitoring and logging readings of the airflow sensor corresponding to the logged performance of the electronic system; and
(J) converting the logged readings of the airflow sensor to airflows using the airflow sensor characterization data.

2. A method for determining airflow through a heat sink in an electronic system, the method comprising:
(A) providing a heat sink for an electronic component, the heat sink comprising:
a first thermally-conductive fin;
a second thermally-conductive fin substantially parallel to and underlying the first thermally-conductive fin and thermally coupled to the first thermally-conductive fin;
an airflow sensor comprising:
an electrically conductive strip coupled to a bottom surface of the first thermally-conductive fin, wherein the conductive strip comprises a first electrical point of contact;
a base portion coupled to a top surface of the second thermally-conductive fin, the base portion having a second electrical point of contact; and
a deformable upper portion electrically coupled to the base portion, wherein the deformable upper portion contacts the electrically conductive strip at a first contact point when there is no airflow, wherein airflow deforms the deformable upper portion so the deformable upper portion contacts the conductive strip at a second contact point farther away from a source of the airflow, and measurement is made between the first and second electrical points of contact to determine airflow through the airflow sensor;
(B) selecting an airflow;
(C) running the selected airflow over the heat sink;
(D) measuring electrical resistance between the first and second electrical points of contact;
(E) recording the measured electrical resistance as correlating to the selected airflow;
(F) repeating steps (B) through (E) for a plurality of airflows; and
(G) storing the measured electrical resistance for the plurality of airflows as airflow sensor characterization data.

3. The method of claim 2 further comprising:
(H) monitoring and logging performance of the electronic system; and (I) monitoring and logging readings of the airflow sensor corresponding to the logged performance of the electronic system.

4. The method of claim 3 further comprising:

(J) reading the performance of the electronic system monitored and logged in step (H);

(K) when airflow for the performance of the electronic system read in step (J) is needed, reading the readings of the airflow sensor monitored and logged in step (I); and (L) converting the airflow sensor readings to airflow using the airflow sensor characterization data.

* * * * *